(12) United States Patent
Nagano et al.

(10) Patent No.: US 8,344,599 B2
(45) Date of Patent: Jan. 1, 2013

(54) QUARTZ CRYSTAL DEVICE AND METHOD FOR SEALING THE SAME

(75) Inventors: Yoji Nagano, Chigaski (JP); Tatsuya Anzai, Hadano (JP); Hideo Tanaya, Suwa (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 13/272,952

(22) Filed: Oct. 13, 2011

(65) Prior Publication Data

US 2012/0025673 A1 Feb. 2, 2012

Related U.S. Application Data

(62) Division of application No. 12/051,463, filed on Mar. 19, 2008, now Pat. No. 8,069,549.

(30) Foreign Application Priority Data

Mar. 22, 2007 (JP) ................................. 2007-073824
Nov. 2, 2007 (JP) ................................. 2007-286419

(51) Int. Cl.
*H01L 41/08* (2006.01)
(52) U.S. Cl. ..................................................... 310/344
(58) Field of Classification Search .................. 310/344, 310/348
See application file for complete search history.

(56) References Cited

U.S. PATENT DOCUMENTS

| | | | |
|---|---|---|---|
| 6,972,256 B2 | 12/2005 | Fukunaga et al. | |
| 2006/0255691 A1 | 11/2006 | Kuroda et al. | |
| 2009/0309459 A1 | 12/2009 | Ogashiwa et al. | |

FOREIGN PATENT DOCUMENTS

| | | |
|---|---|---|
| JP | A 54-78694 | 6/1979 |
| JP | A 58-199549 | 11/1983 |
| JP | A 7-154177 | 6/1995 |
| JP | A 9-36690 | 2/1997 |
| JP | A 11-307661 | 11/1999 |
| JP | A 2000-68780 | 3/2000 |
| JP | A 2000-223606 | 8/2000 |
| JP | A 2001-244772 | 9/2001 |
| JP | A 2005-216508 | 8/2005 |
| JP | A 2005-317793 | 11/2005 |
| JP | A 2005-317794 | 11/2005 |
| JP | 2006-129417 A | 5/2006 |
| JP | A 2006-186748 | 7/2006 |
| JP | A 2007-135191 | 5/2007 |
| JP | 2008-028364 A | 2/2008 |
| WO | WO 00/76066 A1 | 12/2000 |

OTHER PUBLICATIONS

U.S. Appl. No. 12/051,463, filed Mar. 19, 2008.
Japanese Office Action dated Nov. 15, 2011 issued in Japanese Patent Application No. JP 2007-286419.

*Primary Examiner* — Mark Budd
(74) *Attorney, Agent, or Firm* — Oliff & Berridge, PLC

(57) ABSTRACT

A quartz crystal device includes a crystal resonator element and a package including a plurality of components. The plurality of components are bonded using a metal paste sealing material containing a metallic particle having an average particle size from 0.1 to 1.0 μm, an organic solvent, and a resin material in proportions of from 88 to 93 percent by weight, from 5 to 15 percent by weight, and from 0.01 to 4.0 percent by weight, respectively, to hermetically seal the crystal resonator element in the package.

4 Claims, 13 Drawing Sheets

US 8,344,599 B2

QUARTZ CRYSTAL DEVICE AND METHOD FOR SEALING THE SAME

This application is a divisional application of U.S. application Ser. No. 12/051,463, filed Mar. 19, 2008, which claims priority from Japanese Patent Application No. 2007-073824 filed in the Japanese Patent Office on Mar. 22, 2007, and from Japanese Patent Application No. 2007-286419 filed in the Japanese Patent Office on Nov. 2, 2007. The entire disclosures of each of the above-identified applications are hereby incorporated by reference.

BACKGROUND

1. Technical Field

The present invention relates to a metal paste sealing material for hermetically sealing, e.g., a tuning fork type or thickness shear vibration mode crystal resonator element in a package in a quartz crystal device such as a crystal unit, a crystal resonator, a crystal oscillator, a crystal filter, or a crystal sensor, and a quartz crystal device sealed using the metal paste sealing material and a method for sealing the quartz crystal device.

2. Related Art

Demands for smaller, thinner piezoelectric devices have been increasing, and many surface mount piezoelectric devices, which are suitable for mounting onto circuit boards and the like, have hitherto been used.

In surface mount piezoelectric devices, a configuration is employed in which a piezoelectric resonator element is sealed in a package made of an insulating material such as ceramic.

With a package in this former configuration, a piezoelectric resonator element is mounted in a cavity where thin plates made of ceramic materials are laminated on a box base, and a lid is hermetically bonded to the base so that the piezoelectric resonator element is sealed.

Regarding bonding of a base and a lid, in the case of a lid made of metal, a method of placing a metal seal ring on the top end surface of the base and seam-welding the lid to the seal ring (e.g., JP-A-2000-223606) and a method of placing a brazing metal material on the top end surface covered with a metal film of a base and heating and melting the material (see, e.g., JP-A-11-307661) are known.

In the case of a lid made of a ceramic or glass material, a method of heating and melting low-melting glass or resin placed between a base and a lid (see, e.g., JPA-2001-244772) and a method of forming a metallized layer on the lower surface of a lid and melting an eutectic solder so that the lid is bonded to a ceramic case (see, e.g., JP-A-9-36690), and a method of heating and melting an eutectic metallic film layer formed in a bonding portion of a lid (see, e.g., JP-A-54-78694) are known.

However, there is a possibility that a gas produced from low-melting glass and high heat of seam-welding decrease or degrade frequency characteristics of a crystal resonator element.

Low-melting glass contains lead in many cases, and therefore may be not desirable in terms of a possibility of adversely affecting the environment.

To address these points, there has been proposed a crystal unit with a structure having a reduced size and a thinner thickness, in which a crystal plate having a crystal resonator element and an outer frame integrated therein is formed and substrates serving as a base and a cover are, bonded on and under the crystal plate.

To hermetically seal such a structure, for example, a method of anode-bonding of metallic layers, which are formed on the upper and lower surfaces of an outer frame integrated with a crystal unit, with a cover and a case made of glass is known (see, e.g., JP-A-2000-68780).

A method in which surfaces to be mutually bonded of a piezoelectric plate and a substrate that have been subjected to mirror polishing are cleaned by applying ultraviolet rays or oxygen plasma, and the surfaces are bonded together using hydrogen bonding of —OH base by absorbing moisture is also known (see, e.g., JP-A-7-154177).

A method of putting together a bond surface having an Au film thereon of a piezoelectric substrate and a bond surface having an Ag film formed thereon of a protective substrate after plasma treatment and applying pressure and heating the surfaces to achieve diffusion bonding is also known (see, e.g., International Patent Publication No. WO 00/76066 pamphlet).

Further, a surface acoustic wave device formed by applying pressure to a metallic film formed on the main surface of a piezoelectric substrate having an interdigital transducer (IDT) formed thereon and a metallic film formed on the main surface of a base substrate, after activating the surfaces by ion beam and plasma irradiation, to directly bond together the surfaces is known (see, e.g., JP-A-54-78694).

Recently, there have been proposed methods that, in a container to contain electronic components such as piezoelectric resonators, hermetically seal a bonding portion of a box-type container formed of a ceramic material and a cover made of metal using a paste-like sealing member composed of metallic fine particles having an average particle size of 1 to 100 nm and a dispersion material such as amine (see, e.g., JP-A-2005-317793 and JP-A-2005-317794).

A method described in JP-A-2005-317793 applies a sealing member to a container or a cover by screen printing or an inkjet method and heating both the container and the cover in an atmosphere of 250° C. or less to bond together them.

A method described in JP-A-2005-317794 makes a paste-like sealing member become a sheet-like one and, using this one as a cover, bonds together the cover and the container to achieve a hermetic seal.

A piezoelectric device such as a crystal unit is also known.

In this device, a crystal plate are bonded with upper and lower plates with a metallic fine particle paste bonding material containing metallic fine particles that has an average particle size of 1 to 100 nm, the surfaces of which are coated with organic films, and which are dispersed in an organic solvent (see, e.g., JP-A-2006-186748).

The paste bonding material hermetically seals a piezoelectric device by metal-to-metal bonding between metallic fine particles and between metallic films that melts the organic films by heating at about 200° C. to make the metallic fine particles melt with each other, that is, to sinter them.

However, in a pasty sealing member or bond material made of the above-described metallic fine particles, nanoparticles having an average particle size of 100 nm or less are used as the metallic fine particles.

To prevent aggregation of the nanoparticles, a relatively large amount of organic solvent is required as the dispersing agent.

Therefore, gas may be generated from the organic solvent during sealing and remain inside a package, or gas may be generated over time from the organic solvent remaining in a bonding portion, causing a possibility of deteriorating the quality and frequency characteristics of a piezoelectric resonator element.

In general, organic solvent is difficult to handle, and therefore one problem with a sealing member containing a large amount of organic solvent is that the sealing member is not suitable for mass production and requires careful handling for its storage and transportation.

SUMMARY

An advantage of the invention is to provide a method for sealing a piezoelectric device by which gas cannot be generated from organic solvent during bonding and after sealing to adversely affect a piezoelectric resonator element and a package can be hermetically sealed with sufficient bonding strength and high reliability.

Another advantage of the invention is to provide a metal paste sealing material that is used for such a method for sealing a piezoelectric device and is relatively easy to handle and suitable for mass production.

According to a first aspect of the invention, there is provided a quartz crystal device that includes a crystal resonator element; and a package including a plurality of components.

The plurality of components are bonded using a metal paste sealing material that is made of one kind or two or more kinds of Au, Ag, Pt, and Pd and that contains a metallic particle having an average particle size from 0.1 to 1.0 µm, an organic solvent, and a resin material in proportions of from 88 to 93 percent by weight, from 5 to 15 percent by weight, and from 0.01 to 4.0 percent by weight, respectively, to hermetically seal the crystal resonator element in the package.

The metal paste sealing material for use in a quartz crystal device according to the first aspect of the invention has a larger particle size of the metallic particles and a significantly smaller proportion of organic solvent than a metallic paste using nano-micron particles of a former technique.

Therefore, if this metal paste sealing material is sintered at relatively low temperatures, e.g., from about 200 to about 300° C., it is easily possible to form a sintered body of a porous structure in which metallic particles are densified and to sufficiently evaporate an organic solvent and a resin material so that they are substantially not left in the sintered body.

Regarding the sintered body of a porous structure, particularly in the case where the Young's modulus is from 9 to 16 GPa and the density is from 10 to 17 g/cm$^3$, if a relatively low pressure is applied to the sintered body, the metallic particles can be more densely recrystallized.

This recrystallization allows high air tightness of the package of a quartz crystal device to be secured.

Further, the metal paste sealing material has moderate viscosity by containing a minute amount of resin material.

The metal paste sealing material can therefore be applied to a fine pattern using publicly known techniques such as screen printing, dispenser, and inkjet, and does not flow out even after the application so that the pattern can be maintained.

Such good shapability is similarly effective after sintering at low temperatures.

Therefore, when recrystallization has been performed by applying pressure to a sintered body, the same pattern is maintained as that during the application of the metal paste sealing material.

Accordingly, when a package of a quartz crystal device is sealed, the sealing width can be set narrower.

Just by the narrowed amount, the dimensions of the package can be reduced to reduce the entire size of the device, or the internal volume of the package can be increased while the outside dimensions is maintained.

In this case, in a quartz crystal device having a such package structure that the plurality of components include an intermediate crystal plate in which the crystal resonator element and an outer frame are integrally connected, and an upper substrate and a lower substrate bonded with upper and lower surfaces of the intermediate crystal plate, respectively, with the metal paste sealing material, the upper substrate may be made of a silicon material on which an integrated circuit for driving the crystal resonator element is formed, and have a terminal coupled to the integrated circuit on the lower surface; the intermediate crystal plate may have a terminal at a position corresponding to the terminal of the upper substrate, on the upper surface of the outer frame; and the terminal of the upper substrate may be directly coupled with the terminal of the intermediate crystal plate with a conductive coupling material.

Therefore, a smaller, lower crystal oscillator can be achieved.

In this case, in a quartz crystal device having such a package structure that the plurality of components include a base, formed in a box shape having an open top, having the crystal resonator element mounted in an inside thereof, and a lid hermetically bonded onto a top end surface of the base with the metal paste sealing material, the lid may be made of a silicon material on which an integrated circuit for driving the crystal resonator element is formed, and have a terminal coupled to the integrated circuit on a lower surface of the lid; the base may have a terminal at a position corresponding to the terminal of the lid on the top end surface of the base; and the terminal of the lid may be directly coupled with the terminal of the base with a conductive coupling material.

Therefore, a smaller, lower crystal oscillator can similarly be achieved.

Thus, a method for hermetically sealing piezoelectric devices made, e.g., of quartz crystal having various package structures utilizing a metal paste sealing material of one aspect of the invention.

According to a second aspect of the invention, there is provided a method for sealing a quartz crystal device, in order to bond an upper substrate and a lower substrate with upper and lower surfaces, respectively, of an intermediate crystal plate in which a crystal resonator element and an outer frame are integrally connected to hermetically seal the crystal resonator element in a cavity defined between the upper substrate and the lower substrate.

The method includes:
(a) having a metallic thin film on each of upper and lower surfaces of the outer frame of the intermediate crystal plate, and a metallic thin film on a surface to be bonded with the outer frame of each of the upper substrate and the lower substrate;
(b) applying the above-described metal paste sealing material of one aspect of the invention to at least one of the metallic thin film on the upper surface of the outer frame and the metallic thin film of the upper substrate, and heating the metal paste sealing material to form a primary sintered body having a porous structure with a Young's modulus of 9 to 16 GPa and a density of 10 to 17 g/cm$^3$;
(c) similarly applying the above-described metal paste sealing material of one aspect of the invention to at least one of the metallic thin film on the lower surface of the outer frame and the metallic thin film of the lower substrate, and heating the metal paste sealing material to form a primary sintered body having a porous structure with a Young's modulus of 9 to 16 GPa and a density of 10 to 17 g/cm$^3$;
(d) placing the intermediate crystal plate and the upper substrate on top of each other while bringing one of the metallic thin films having the primary sintered bodies formed thereon into contact with the other of the metallic thin films, and applying pressure to the primary sintered bodies to densely recrystallize metallic particles thereof to hermetically bond the intermediate crystal plate and the upper substrate in the outer frame; and (e) placing the intermediate crystal plate and the lower substrate on top of each other while bringing one of the metallic thin films having the primary sintered bodies formed thereon into contact with the other of the metallic thin films, and applying pressure to the primary sintered bodies to densely recrystallize metallic particles thereof to hermetically bond the intermediate crystal plate and the lower substrate in the outer frame.

As described above, a metal paste sealing material of one aspect of the invention keeps sufficient and good shapability not only during its application but also after the steps (b) to (e), and has high air tightness after the steps (d) and (e) due to recrystallization of the metallic particles.

This enables the sealing width in the outer frame to be made significantly narrower than a former one.

Therefore, it is possible to reduce the outside dimensions of the intermediate crystal plate to reduce the entire size of the quartz crystal device.

Alternatively, it is possible to increase the inside dimensions while maintaining the outer dimensions of the outer frame, and increase, by just the amount of the increase of the inside dimensions, the outside dimensions of a crystal resonator element that can be mounted, thereby improving the characteristics of a quartz crystal device.

The primary sintered body having the above-described Young's modulus and density is not in the original paste state but has some extent of softness.

Accordingly, in placing the intermediate crystal plate and each of the upper substrate and the lower substrate on top of each other and applying pressure to them in the steps (d) and (e), there is no possibility that the material flies to adhere to the crystal resonator element or to be left inside the device.

Therefore, the vibration characteristics of the quartz crystal device is maintained without being deteriorated.

The porous structure of a primary sintered body can be formed by performing the steps (b) and (c) at relatively low temperatures.

Therefore, if the steps (b) and (c) are performed by applying the metal paste sealing material to the intermediate crystal plate, the thermal stress applied to the crystal resonator element can be suppressed.

Further, since the organic solvent and resin material of the metal paste sealing material are substantially not left in the primary sintering body, outer gas of the organic solvent or the resin is not generated from a primary sintered body, and is not left inside the piezoelectric device in the steps (d) and (e).

Further, outer gas of the organic solvent or resin cannot be sequentially generated.

Therefore, good quality and frequency characteristics of the quartz crystal device can be maintained for a long period.

Regarding a quartz crystal device having this package structure, the upper substrate and the lower substrate may be made of the same quartz crystal as of the intermediate crystal plate.

Accordingly, the entire package has the same coefficient of thermal expansion.

This suppresses distortion caused by changes in environmental temperature, etc., which improves reliability.

In this case, the upper substrate may be made of a silicon material and include an integrated circuit for driving the crystal resonator element and a terminal coupled to the integrated circuit; the intermediate crystal plate may have a terminal to be coupled to the terminal of the upper substrate on the upper surface of the outer frame; and in the step (d), in placing the intermediate crystal plate and the upper substrate on top of each other, the terminal of the upper substrate may be directly coupled with the terminal of the intermediate crystal plate with a conductive coupling material.

Thus, a quartz crystal device functioning as an oscillator can be manufactured with a relatively small number of man-hours.

According to a third aspect of the invention, there is provided a method for sealing a quartz crystal device, in order to bond a lid with a top end surface of a base that is formed in a box shape having an open top and has a crystal resonator element mounted in an inside thereof to achieve a hermetic seal.

The method includes:

(a) having a metallic surface on the top end surface of the base, and a metallic surface on a surface of the lid to be bonded with the top end surface;

(b) applying the metal paste sealing material of one aspect of the invention to at least one of the metallic surface on the top end surface of the base and the metallic surface of the lid, and heating the metal paste sealing material to form a primary sintered body having a porous structure with a Young's modulus of 9 to 16 GPa and a density of 10 to 17 $g/cm^3$; and (c) placing the lid on top of the base while bringing one of the metallic surfaces having the primary sintered bodies formed thereon into contact with the other of the metallic surfaces, and applying pressure to the primary sintered bodies to densely recrystallize metallic particles thereof to achieve a hermetic seal.

In a quartz crystal device having such a package structure, the excellent operation and effect of the above-described sealing method according to one aspect of the invention are similarly obtained.

In particular, unlike former methods of bonding the base and the lid with a brazing metal material and by seam-welding, the effect of thermal stress to a piezoelectric resonator element mounted on the base can be suppressed.

Since the method involves no danger that a sealing material flies to adhere to a crystal resonator element as in the former seam-welding, the vibration characteristics of a quartz crystal device can be maintained without being deteriorated.

Further, since a bonding portion where the metallic particles are recrystallized by the step (c) cannot be remelted in a high-temperature environment as in the former bonding using a brazing metal material, high air tightness is ensured over time.

Therefore, if a quartz crystal device is heated in a repair process of a faulty part after being mounted on a circuit board or the like, air tightness cannot be reduced, allowing high reliability to be maintained.

In a piezoelectric device, e.g., of quartz crystal having this package structure, the lid may be made of a glass plate, and have a metallic film formed on one surface thereof.

This can provide a metallic surface for being bonded with a primary sintered body on the top end surface of the base or for application of a metal paste sealing material.

In this case, a metallic film is not formed in some area of the lower surface of the lid, allowing the frequency of the crystal resonator element to be adjusted after sealing by irradiation of laser light transmitting the lid from the outside.

In this case, the lid may be made of a metallic plate and one surface thereof can be bonded with a primary sintered body on the top end surface of the base without the application of a material, or can be utilized as a metallic surface for applying a metal paste sealing material.

This is advantageous because formation of a metallic film is therefore unnecessary.

In this case, the lid may be made of a silicon material and includes an integrated circuit for driving the crystal resonator element and a terminal coupled to the integrated circuit; the base may have a terminal to be coupled to the terminal of the lid on the top end surface of the base; and in the step (c), in placing the lid on top of the base, the terminal of the lid may be directly coupled with the terminal of the base with a conductive coupling material.

Thus, a quartz crystal device functioning as an oscillator can be manufactured with a relatively small number of man-hours.

In this case, in the steps (d) and (e), heating may be simultaneous with applying pressure.

Thus, bonding of metallic particles of the primary sintered body by recrystallization can be made better and effectively.

Further, according to a fourth aspect of the invention, there is provided a method for sealing an electronic component, in an electronic component having a package that includes a first component and a second component, in order to bond the first component with the second component to hermetically seal an electronic element or the like in a cavity defined between the first component and the second component.

The method includes:

(a) having metallic surfaces on surfaces to be bonded with each other of the first component and the second component;

(b) applying a metal paste sealing material of one aspect of the invention to at least one of the metallic surfaces of the first component and the second component, and heating the metal paste sealing material to form a primary sintered body having a porous structure with a Young's modulus of 9 to 16 GPa and a density of 10 to 17 $g/cm^3$; and (c) placing one and the other of the metallic surfaces having the primary sintered bodies formed thereon on top of each other while bringing them into contact with each other, and applying pressure to the primary sintered bodies to densely recrystallize metallic particles thereof to achieve a hermetic seal.

Thus, various electronic components other than piezoelectric devices can be hermetically sealed in packages using a metal paste sealing material of one aspect of the invention.

In the same way, the above-described excellent operation and effect of a method for sealing a quartz crystal device according to one aspect of the invention can be obtained.

In this case, by performing heating simultaneously with applying pressure in the step (c), bonding of metallic particles of the primary sintered body by recrystallization can be made better and effectively.

BRIEF DESCRIPTION OF THE DRAWINGS

Preferred embodiments of the invention will be described in detail below with reference to the accompanying drawings.

DETAILED DESCRIPTION OF EMBODIMENTS

Embodiments of the invention will be described.

First, a metal paste sealing material according to one embodiment of the invention is composed of metallic particles, an organic solvent, and a resin material.

The metallic particles are submicron particles having an average particle size of 0.1 to 1.0 μm made, e.g., of one kind or two or more kinds of Au, Ag, Pt, and Pd.

As the organic solvent, ester alcohol, etc., that can evaporate at a relatively low temperature of about 200° C. are used.

The resin material is added to provide some extent of viscosity to the metal paste sealing material.

For example, a cellulosic resin material is used as the resin material.

Their proportions in the metal paste sealing material are set such that the metallic powder is from 88 to 93 percent by weight, the organic solvent is from 5 to 15 percent by weight, and the resin material is from 0.01 to 4.0 percent by weight.

A metal paste sealing material of one embodiment of the invention is larger in size of a metallic particle and significantly smaller in percentage of an organic solvent than a metal paste using nano-micron size particles of the former art.

Therefore, sintering this material at relatively low temperatures, e.g., from about 200 to about 300° C. allows easy formation of a sintered body of a porous structure where metallic particles are melt bonded to be densified, which will be described later.

Moreover, even sintering at low temperatures allows an organic solvent and a resin material in a metal paste sealing material to be sufficiently evaporated such that they are substantially not left in the sintered body.

In the sintered body of a porous structure, it is easy to make the metallic particles more dense to recrystallize them even by applying relatively low pressure.

High air tightness can be secured by this recrystallization, which is suitable particularly for vacuum sealing of packages of piezoelectric devices and electronic components.

Further, a metal paste sealing material of one embodiment of the invention contains a minute amount of resin material, and therefore has such moderate viscosity that the metal paste sealing material can be easily applied to a desired, fine pattern using known techniques such as screen printing, dispenser, and inkjet and, after the application, the pattern can be maintained without the material flowing out.

Such good shapability is the same even after the metal paste sealing material is sintered at low temperatures.

When recrystallization has been performed by applying pressure to a sintered body, the same pattern is maintained as that during the application of the metal paste sealing material.

Accordingly, when sealing a package of a piezoelectric device or the like, the sealing width can be set narrower.

Figure 1A:
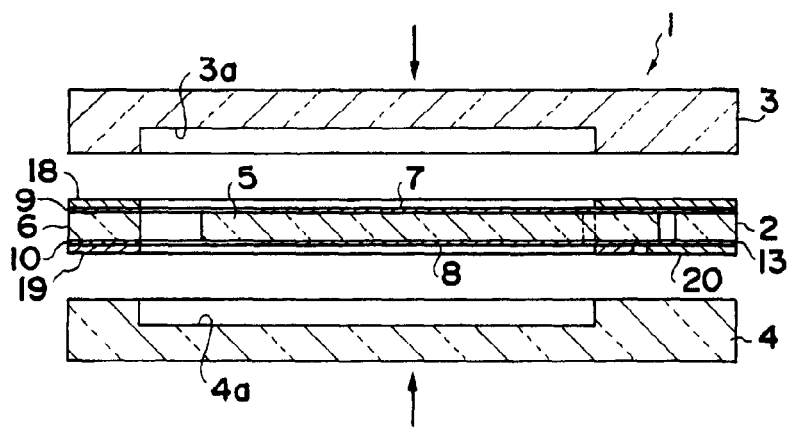
FIGS. 1A and 1B are sectional views illustrating a process of sealing a crystal unit of a first embodiment according to a method of one embodiment of the invention.
Figure 1B:
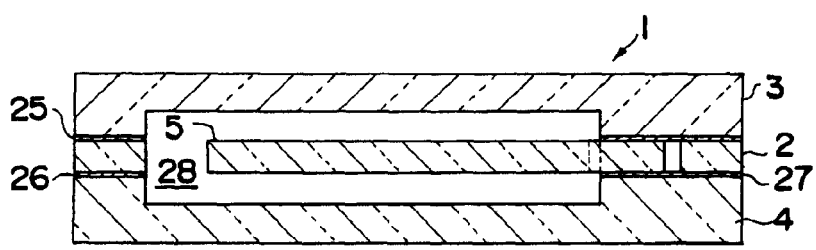

FIGS. 1A and 1B illustrate a process of sealing a crystal unit of a first embodiment by a method of one embodiment of the invention.

A crystal unit 1 of the present embodiment includes a intermediate crystal plate 2 having a crystal resonator element, an upper substrate 3 serving as a cover of a package, and a lower substrate 4 serving as a base.

The intermediate crystal plate 2 is formed of an AT cut crystal plate, and the upper and lower substrates 3 and 4 are laminated on and under the intermediate crystal plate 2 such that the substrates and the plate are integrally bonded.

The upper and lower substrates 3 and 4 are preferably formed of crystal thin plates in the same manner.

Alternatively, they may be formed of a glass material and silicon.

Figure 2A:
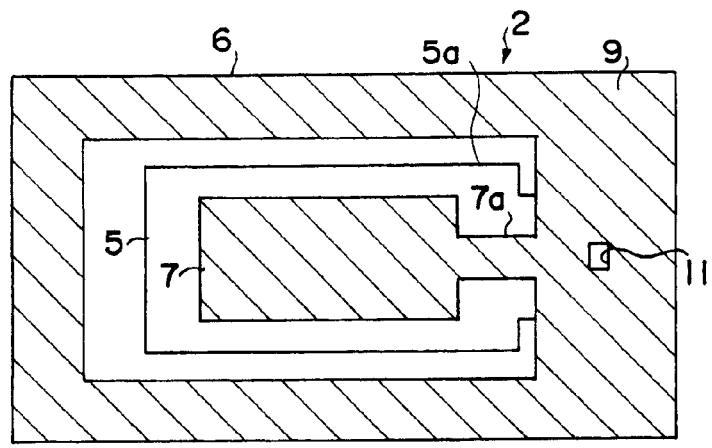
FIG. 2A is a top view of an intermediate crystal plate constituting the crystal unit of the first embodiment.
Figure 2B:
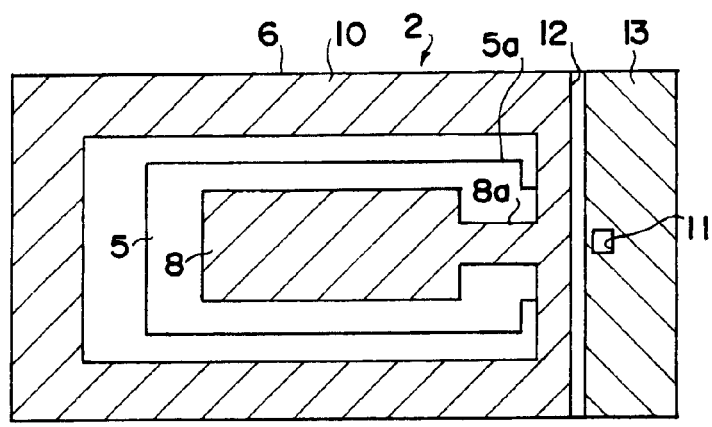
FIG. 2B is a bottom view of the intermediate crystal plate.
Figure 2C:
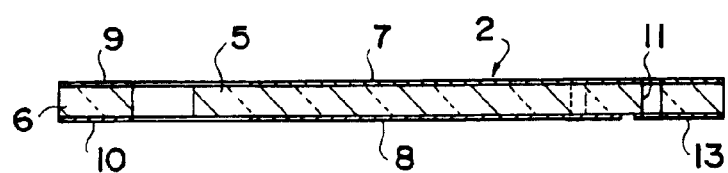
FIG. 2C is a sectional view of the intermediate crystal plate.

The intermediate crystal plate 2 is made of a crystal thin plate having a uniform thickness as a whole, and has a thickness shear mode crystal resonator element 5 and an outer frame 6 integrally connected thereto with a base portion 5a of the element, as illustrated in FIGS. 2A to 2C.

Formed on upper and lower surfaces of the crystal resonator element 5 are excitation electrodes 7 and 8, respectively.

The excitation electrodes 7 and 8 are led out from the base portion 5a through wiring films 7a and 8a, and electrically coupled to conductive metallic thin films 9 and 10 that are formed over all the peripheries of the upper and lower surfaces of the outer frame 6, respectively.

A through hole 11 is disposed at an end in the longitudinal direction of the outer frame 6 on a side where the crystal resonator element 5 is connected.

Formed on the lower surface of the foregoing end in the longitudinal direction is a conductive metallic thin film 13 separated from the conductive metallic thin film 10 by a crystal elemental area 12.

The conductive metallic thin film 13 is electrically coupled with the conductive metallic thin film 9 on the upper surface through a conductive film inside the through hole 11.

Figure 3A:
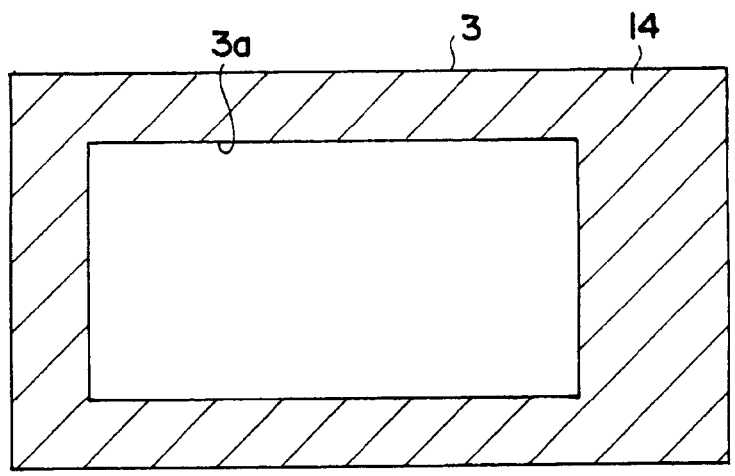
FIG. 3A is a bottom view of an upper substrate constituting the crystal unit of the first embodiment.
Figure 3B:
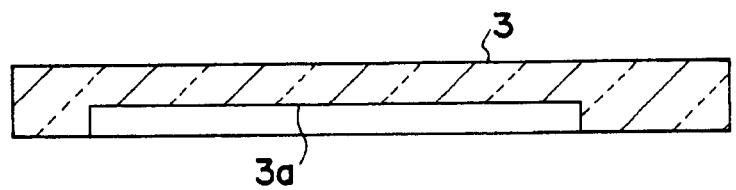
FIG. 3B is a sectional view of the upper substrate.

In the upper substrate 3, a recess 3a is formed in a surface facing the intermediate crystal plate 2, that is, the lower surface, as illustrated in FIGS. 3A and 3B.

A periphery surrounding the recess 3a in the lower surface of the upper substrate 3 constitutes a surface to be bonded with the intermediate crystal plate 2, and is coated with a metallic thin film 14, which corresponds to the conductive metallic thin film 9 of the aforementioned outer frame.

Figure 4A:
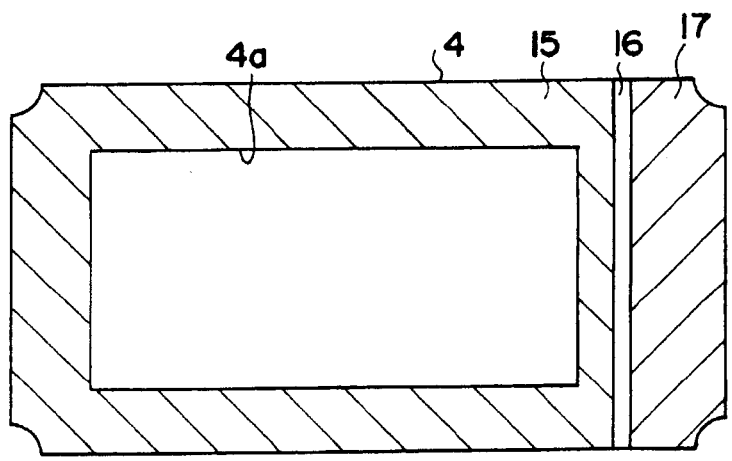
FIG. 4A is a top view of a lower substrate constituting the crystal unit of the first embodiment.
Figure 4B:
FIG. 4B is a sectional view of the lower substrate.

In the lower substrate 4, a recess 4a is similarly formed in a surface facing the intermediate crystal plate 2, that is, the upper surface, as illustrated in FIGS. 4A and 4B.

A periphery surrounding the recess 4a in the upper surface of the lower substrate 4 constitutes a surface to be bonded with the intermediate crystal plate 2, and a metallic thin film 15 that corresponds to the conductive metallic thin film 10 of the aforementioned outer frame and a metallic thin film 17 that is separated from the foregoing metallic thin film by a crystal elemental area 16 and corresponds to the conductive metallic thin film 13 of the outer frame.

Formed on the lower surface of the lower substrate 4 is a leading electrode (not illustrated) to the outside.

The conductive metallic thin films 9, 10, and 13 of the intermediate crystal plate and the metallic thin films 14, 15, and 17 of the upper and lower substrates are preferably formed by laminating an Au film, e.g., on a Cr film, a Ni film, a Ni/Cr film, a Ti film or a Ni—Cr film as a base film.

In another embodiment, these metallic thin films can be formed by Al, Ag, Cu, Pd, Pt, Sn, Ti, Al/Si, or Ni/Cr.

These metallic thin films are easily formed using methods that are publicly known, such as sputtering, evaporation, plating, and direct plating, alone or in combination.

According to a method of one embodiment of the invention, the above-described metal paste sealing materials of one embodiment of the invention, which are denoted by reference numerals 18, 19, and 20, are applied onto the conductive metallic thin films 9, 10, and 13 on the upper and lower surfaces of the outer frame 6 of the intermediate crystal plate 2 as illustrated in FIG. 1A.

The metal paste sealing materials are applied by publicly known methods such as screen printing, a dispenser, or inkjet.

Figure 5A:
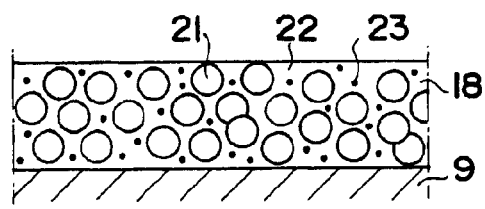
FIGS. 5A to 5C are partially enlarged sectional views schematically illustrating a process of a metal paste sealing material from its paste state to recrystallization in the process of sealing of FIGS. 1A and 1B.

FIG. 5A exemplifies the state of the metal paste sealing material 18 applied onto the conductive metallic thin film 9.

As shown in the figure, the metal paste sealing material 18 is such that metallic particles 21 are substantially uniformly dispersed in an organic solvent 22.

Further, resin 23 is uniformly dispersed in the organic solvent 22, and provides the metal paste sealing material with some extent of viscosity.

Due to this viscosity, a metal paste sealing material of one embodiment of the invention has a sufficient shapability so that the material can be applied to a pattern with high precision and the pattern can be maintained.

For example, if the foregoing metallic particles are Au, the metal paste sealing material can be formed finely to an extent of a minimum pattern width of about 0.05 mm and a minimum thickness of about 10 µm.

Then, the intermediate crystal plate 2 is heated at relatively low temperatures from about 200 to about 300° C. for a short time such as about from 10 to about 30 minutes using publicly known means such as a hot plate, a clean oven, and a belt furnace, thereby performing a primary sintering process.

By this primary sintering process, metallic particles of the above-described metal paste sealing material are sintered to form a primary sintered body.

Figure 5B:
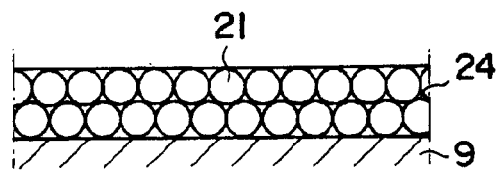

As exemplified in FIG. 5B, in a primary sintered body 24, the organic solvent 22 and the resin 23 evaporate from the metal paste sealing material so that the metallic particles 21 adjacent to one another are melt bonded to one another with slight gaps left therebetween to form a porous structure where the metallic particles are densely in contact with one another.

Further, in the foregoing primary sintered body, the metallic particles 21 are densified in interfaces with the metallic thin films on the lower side, and therefore are bonded with the metallic thin films.

In some cases, the resin 23 does not completely evaporate by the primary sintering process such that part of the resin remains.

In such cases, remaining resin enters into gaps between metallic particles 21, and therefore has no effect on forming the above-described porous structure.

According to one embodiment of the invention, the primary sintered body 24 having a Young's modulus of 9 to 16 GPa and a density of 10 to 17 g/cm$^3$ in the porous structure is the most advantageous.

It has been confirmed that the metallic particles 21 are relatively maintained in their original spherical shapes when the temperature in a primary sintering process is low, but sintering of the surface proceeds such that the metallic particles 21 lose their original shapes to be melt bonded to one another as the temperature rises.

The lower the temperature in a primary sintering process, the lower the Young's modulus and the density of the primary sintered body 24 are, whereas the higher the temperature, the higher they are.

Since heating in a primary sintering process is at relatively low temperatures, its thermal stress applied to the crystal resonator element 5 of the intermediate crystal plate 2 can be suppressed.

Then, the upper and lower substrates 3 and 4 are placed on top of the upper and lower surfaces of the intermediate crystal plate 2 while being aligned therewith, respectively, to bring the foregoing primary sintered body and the metallic thin films 14, 15, and 17 into contact with each other, and pressure is applied uniformly to the sintered body and the metallic thin films.

Thus, a secondary sintering process has been performed.

The primary sintered body 24 having the above-described Young's modulus and density is not in its original paste state and has appropriate softness.

There is therefore no possibility that applying pressure causes the material of the body to fly to adhere to the crystal resonator element 5 or to be left inside a cavity 28.

Thus, after the crystal resonator element 1 is sealed, its vibration characteristics are maintained without deterioration.

The conditions of application of pressure in a secondary sintering process vary in accordance with dimensions of an intermediate crystal plate and substrates, the sizes of bond surfaces to be bonded, and the amount and thickness of the used metal paste sealing material.

In the embodiment, for example, pressure from about 39 to about 176 N/mm$^2$ is applied for about 10 minutes.

Further, applying pressure while heating at temperatures, e.g., from about 200 to about 350° C. allows the above-described secondary sintering process to be performed better.

Since this heating is also is at relatively low temperatures, its thermal stress applied to the crystal resonator element 5 of the intermediate crystal plate 2 is suppressed.

Figure 5C:
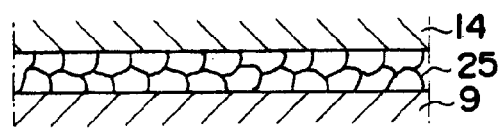

By this secondary sintering process, the metallic particles are melt bonded more densely to completely crush the gaps of the porous structure illustrated in FIG. 5B in the primary sintered body so that a recrystallized bond film 25 is formed as exemplified in FIG. 5C.

Regarding bond films 25 to 27, the metallic particles thereof are tightly bonded to be integrated with the metallic thin films 14, 15, and 17 of the upper and lower substrates in interfaces with these thin films.

In this way, the intermediate crystal plate 2 and each of the upper and lower substrates 3 and 4 are bonded with high air-tightness and, in the cavity 28 defined therebetween, the crystal resonator element 5 is sealed in a state of floating while being cantilevered by the base portion 5a.

If the secondary sintering process is performed in a vacuum atmosphere or an inactive gas atmosphere, the crystal resonator element 5 can be vacuum sealed or gas sealed.

If the primary sintered body of the intermediate crystal plate 2 and the metallic thin films of the upper and lower substrates 3 and 4, which are to be bonded, are subjected to surface activation and cleaning by a plasma treatment and an ion beam treatment that have been publicly known, the body and the films can be bonded better and stably.

This improves bonding reliability.

As described above, a metal paste sealing material of one embodiment of the invention keeps sufficient and good shapability not only during its application but also after the primary and secondary sintering processes, and has high air tightness after the secondary sintering process due to recrystallization of the metallic particles.

This enables the sealing width in the outer frame 6 to be made significantly narrower than a former one.

As a result, it is possible to reduce the outside dimensions of the intermediate crystal plate 2 to reduce the entire size of the crystal unit 1.

It is also possible to increase the dimensions of the cavity 28 while maintaining the outer dimensions of the outer frame 6, and increase, by just the amount of the dimension increase of the cavity 28, the outside dimensions of the crystal resonator element 5 that can be mounted to thereby improve the characteristics of a crystal unit.

According to one embodiment of the invention, since an organic solvent and resin of the foregoing metal paste sealing material sufficiently evaporate in the primary sintering process, outer gas of the organic solvent or the resin is not generated from a primary sintered body, and is not left in the cavity 28 of the crystal unit 1 in the secondary sintering process.

Outer gas of the organic solvent or the resin cannot be sequentially generated from the bond films 25 to 27.

Therefore, good quality and frequency characteristics of the crystal unit 1 can be maintained for a long period.

In another embodiment, the foregoing metal paste sealing material can also be applied to the metallic thin films 14, 15, and 17 of the foregoing upper and lower substrates.

A primary sintering process is performed by heating the metal paste sealing material on these metallic thin films in the same way as in the case of the intermediate crystal plate 2, thereby forming a primary sintered body of the aforementioned porous structure.

Then, the intermediate crystal plate 2 is sandwiched between the upper and lower substrates 3 and 4 while being aligned therewith to bring their primary sintered bodies into contact with each other, and pressure is applied to the primary sintered bodies in the same way as in the above-described embodiment.

Thus, a secondary sintering process has been performed.

In interfaces between the primary sintered bodies, the metallic particles are closely melt bonded to be recrystallized so that substantially one bond film is formed.

Therefore, the intermediate crystal plate 2 and the upper and lower substrates 3 and 4 can be more firmly bonded.

In still another embodiment, the foregoing metal paste sealing material may be applied only to the metallic thin films 14, 15, and 17 of the foregoing upper and lower substrates, not to the foregoing intermediate crystal plate.

Since the aforementioned primary sintering process is performed only for the upper and lower substrates, the heating temperature cannot affect a crystal resonator element of the intermediate crystal plate 2.

In yet another embodiment, first the intermediate crystal plate 2 and one of the upper and lower substrates 3 and 4, and then the intermediate crystal plate 2 and the other may be bonded.

In the latter bonding, the secondary sintering process may be performed in a vacuum or predetermined gas atmosphere to vacuum seal or gas seal the crystal resonator element 5.

Further, in performing the secondary sintering process, pressure is applied to a crystal wafer while heating it at appropriate temperatures.

Next, a process of collectively manufacturing a large number of crystal units 1 by applying a method of one embodiment of the invention will be described.

Figure 6A:
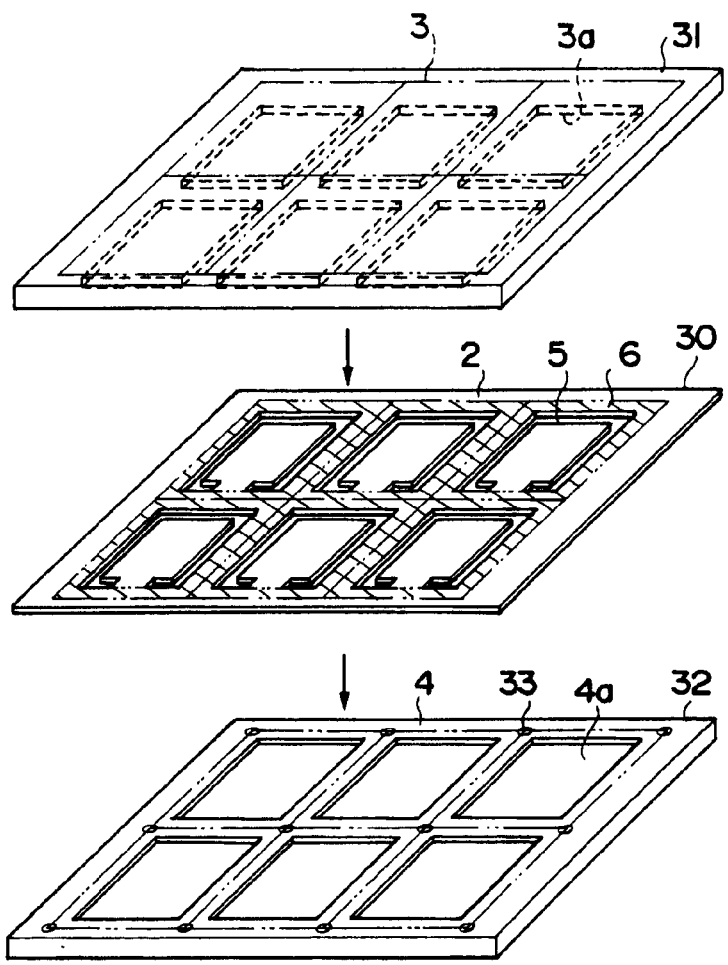
FIG. 6A is a schematic perspective view illustrating three crystal wafers to be integrally laminated to one another.

First, as illustrated in FIG. 6A, a large-sized intermediate crystal wafer 30 is prepared in which a plurality of intermediate crystal plates 2 are arranged sequentially in the longitudinal and horizontal directions.

The shapes of the crystal resonator element 5 and the outer frame 6 of the each intermediate crystal plate 2 are formed, e.g., by photoetching the crystal wafer.

In areas corresponding to the crystal resonator element 5 and the outer frame 6 of the upper and lower surfaces of the intermediate crystal wafer 30, a conductive material is deposited by evaporation, sputtering, etc., to form a film and the film is patterned, thereby forming the aforementioned excitation electrodes, wiring films, and conductive metallic thin films.

Concurrently, large-sized upper and lower crystal wafers 31 and 32 in which, respectively, a plurality of upper and lower substrates 3 and 4 are arranged sequentially in the longitudinal and horizontal directions are prepared.

In the both crystal wafers 31 and 32, a plurality of recesses 3a and 4a are formed on the surfaces each facing the intermediate crystal wafer 30, e.g., by etching or sand blasting.

Further, in the both crystal wafers 31 and 32, metallic thin films (not illustrated) corresponding to the metallic thin films 14 on lower surfaces of the upper substrates 3 and the metallic thin films 15 and 17 on the upper surfaces of the lower substrates 4 are formed on the surfaces each facing the intermediate crystal wafer 30, e.g., by evaporation or sputtering.

In the lower crystal wafer 32, a circular through-hole 33 is formed at each intersection of outer lines of the lower substrates 4 that are orthogonal to each other in the longitudinal and horizontal directions.

On the lower surface of the lower crystal wafer 32, a leading electrode of each lower substrate 4 to the outside is formed.

Figure 6B:
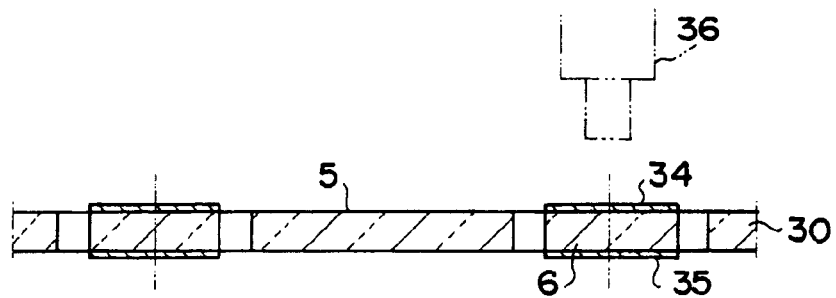
FIG. 6B is a partially enlarged sectional view illustrating an intermediate crystal wafer to which a metal paste sealing material is applied.

Then, as illustrated in FIG. 6B, metal paste sealing materials 34 and 35 of one embodiment of the invention are applied onto the aforementioned conductive metallic thin films in areas corresponding to the outer frames 6 on the upper and lower surfaces of the intermediate crystal wafer 30.

The metal paste sealing materials 34 and 35 have a moderate viscosity due to the above-described proportions, and therefore they can easily be applied to a fine pattern by screen printing and the pattern can be maintained.

In another embodiment, the materials may be continuously applied using a dispenser 36 as illustrated by an imaginary line in FIG. 6B, or may be applied in sequential dots by an inkjet method.

The metal paste sealing material of one embodiment of the invention can be applied in dots having a diameter of 0.1 mm and a thickness of 15 µm due to the above-described proportions.

In a still another embodiment, a resist frame is formed to define an area to which the foregoing metal paste sealing material is to be applied, and the inside of the area is filled with the metal paste sealing material, allowing the metal paste sealing material to be applied.

This resist frame can be formed with high precision by patterning a photoresist utilizing a photolithography technique, and can easily be removed after application of the metal paste sealing material or a primary sintering process.

Then, the intermediate crystal wafer 30 is heated at temperatures about from 200 to about 300° C. for a predetermined time by a hot plate or the like in the same way as in the case illustrated in FIG. 1A, thereby performing a primary sintering process.

By this primary sintering process, the metal paste sealing materials 34 and 35 are sintered to form a primary sintered body of the aforementioned porous structure.

Figure 7A:
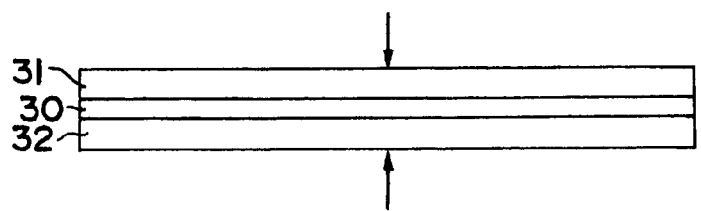
FIG. 7A is an explanatory view illustrating procedures for bonding three crystal wafers.

The upper and lower crystal wafers 31 and 32 are placed on top of upper and lower surfaces of the intermediate crystal wafer 30 while being aligned therewith as illustrated in FIG. 7A, and a secondary sintering process is performed by applying pressure to the wafers in the same way as in the case illustrated in FIG. 1B.

The foregoing secondary sintering process may be performed while the foregoing crystal wafers are heated at temperatures, e.g., from about 200 to about 350° C.

The secondary sintering process may be performed in a vacuum or predetermined gas atmosphere to vacuum seal or gas seal the crystal resonator element 5.

Further, the primary sintered bodies on both upper and lower surfaces of the foregoing intermediate crystal wafer and metallic thin films of the upper and lower wafers are subjected to a plasma treatment by an appropriate reaction gas or uniformly subjected to surface activation by applying ion beams.

This allows achievement of better and more stable bonding and improvement in bonding reliability.

Figure 7B:
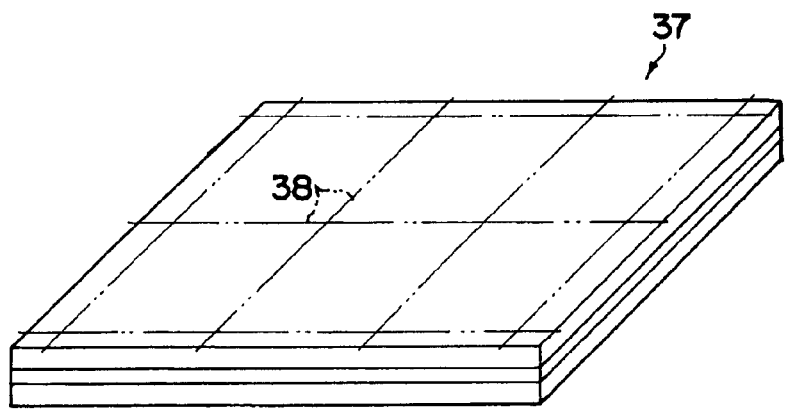
FIG. 7B is a schematic perspective view illustrating a bonded body of three crystal wafers.

In this way, a crystal wafer laminate 37 illustrated in FIG. 7B is obtained in which the intermediate crystal wafer 30 and the upper and lower crystal wafers 31 and 32 are hermetically bonded.

As illustrated in the figure, the crystal wafer laminate 37 is cut along outer lines 38 of crystal units that are orthogonal in the longitudinal and horizontal directions by dicing, etc., to be divided into individual elements, thereby completing the crystal unit 1 illustrated in FIGS. 1A and 1B.

The aforementioned leading electrode on the bottom surface of each lower substrate 4 may also be formed by sputtering, etc., while the crystal wafer laminate 37 is in its state before being diced.

Figure 8:
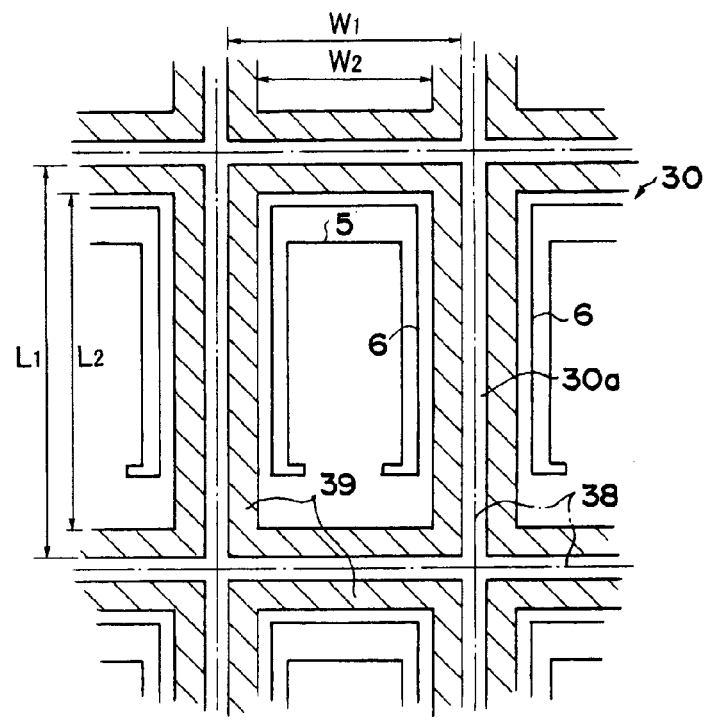
FIG. 8 is a partially enlarged plan view illustrating the intermediate crystal wafer of FIG. 6 to which a metallic paste material is applied.

As illustrated in FIG. 8, a metal paste sealing material of one embodiment of the invention was applied onto the intermediate crystal wafer 30 illustrated in FIG. 6A by screen printing.

A metal paste sealing material 39 was formed in a fine, rectangular frame-shaped pattern in each outer frame 6 such that constant width areas 30a were left on both sides of the outer lines 38 for dicing.

The composition and solid state properties of the metal paste sealing material 39 were set as follows.
Composition: metal (Au) particle content: 88 wt %, average particle size of 0.3 μm
  organic solvent content: 10.4 wt %
  resin content: 1.6 wt %
Solid state properties: viscosity: 190 Pa·s
  thixotropic ratio: 4.9

As a result, a fine pattern of the metal paste sealing material 39 was formed in a rectangular frame shape having external dimensions of 2.95 mm (L1)×1.25 mm (W1), internal dimensions of 2.85 mm (L2)×1.15 mm (W2), and a line width of 0.05 mm.

In another embodiment, first the intermediate crystal wafer 30 and one of the upper and lower crystal wafers 31 and 32, and then the intermediate crystal wafer 30 and the other may be bonded.

In this case, in a later process of bonding a third one of the foregoing crystal wafers, a secondary sintering process may be performed in a vacuum or predetermined gas atmosphere to vacuum seal or gas seal each crystal resonator element 5.

With two of the foregoing crystal wafers bonded in advance, characteristics testing and frequency measurement may be carried out for each crystal resonator element 5.

Further excitation electrodes of each crystal unit 5 may be partially removed, e.g., by irradiation of laser light so that the frequency is individually adjusted.

In this case, in the intermediate crystal wafer 30, the aforementioned conductive metallic thin film is formed to obtain a pattern on each of the upper and lower surfaces of each outer frame 6 except for portions of line widths for dicing along the outer lines 38 of crystal units.

Similarly, in the upper and lower crystal wafers 31 and 32, the aforementioned metallic thin films corresponding to the metallic thin films 14, 15, and 17 of the aforementioned upper and lower substrates are formed to obtain patterns except for portions of line widths for dicing along the outer lines 38 of crystal units.

The metal paste sealing materials 34 and 35 have good shapability as described above and are applied only onto the conductive metallic thin film.

Each crystal resonator element 5 of the intermediate crystal wafer 30 is therefore electrically separate and independent from other adjacent crystal resonator elements in the wafer state around the primary and secondary sintering processes.

The invention can be similarly applied to piezoelectric devices of various package structures that are different from the above-mentioned first embodiment.

Figure 9A:
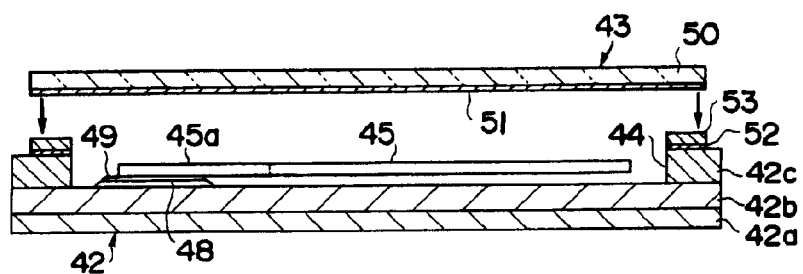
FIG. 9A is a sectional view illustrating a process of sealing a crystal unit of a second embodiment by a method of one embodiment of the invention.
Figure 9B:
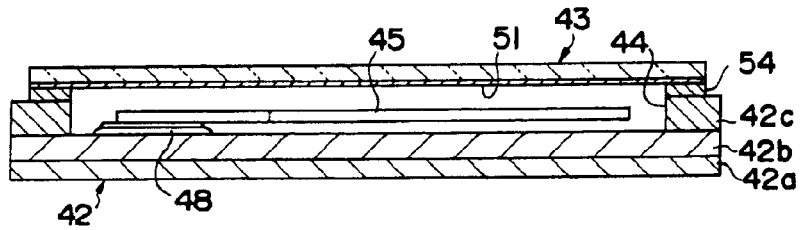
FIG. 9B is a sectional view illustrating the sealed crystal unit of the second embodiment.

FIGS. 9A and 9B illustrate a process of sealing a crystal unit of a second embodiment by a method of one embodiment of the invention.

A crystal unit 41 of the present embodiment has a package structure including a rectangular box-shaped base 42 and a flat plate-shaped lid 43, which are made of insulating materials.

Figure 10:
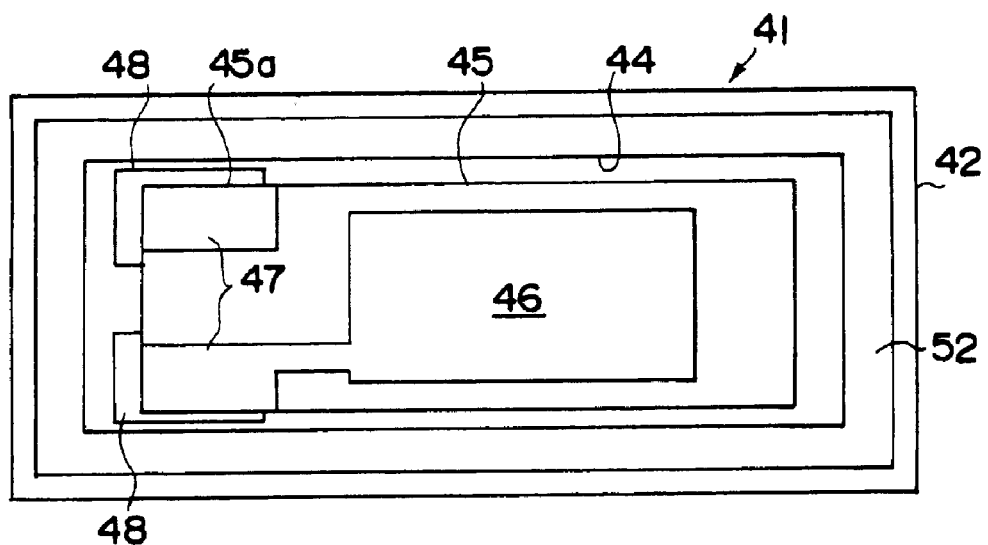
FIG. 10 is a plan view of a base of the crystal unit of the second embodiment.

The base 42 is formed in a box shape having an open top by laminating a plurality of ceramic thin plates 42a to 42c, as illustrated in FIGS. 9A and 10.

A crystal resonator element 45 is mounted in a cavity 44 defined inside the base 42.

The crystal resonator element 45 of the embodiment is a thickness shear mode resonator element made, e.g., of an AT cut crystal plate, and excitation electrodes 46 are formed on both upper and lower surfaces of the element and leading electrodes 47 from the excitation electrodes are formed on both sides of one end of the element, that is, a base portion 45a.

A pair of electrode pads 48 are formed near one end in the longitudinal direction on the bottom surface of the cavity 44 of the base 42.

The leading electrodes 47 are fixed to the electrode pads 48 corresponding thereto with a conductive adhesive 49 in the base portion 45a, so that crystal resonator element 45 is electrically coupled and substantially horizontally supported while being cantilevered.

Figure 11:
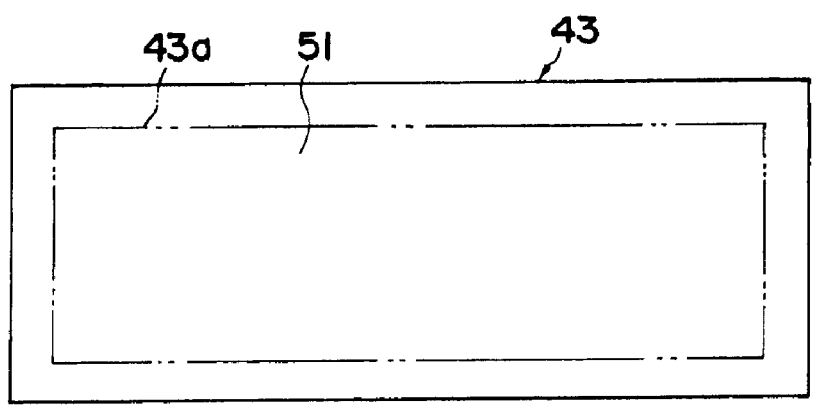
FIG. 11 is a bottom view of a lid of the crystal unit of the second embodiment.

As illustrated in FIG. 11, the lid 43 of the embodiment is formed of a flat, rectangular thin plate 50 of a glass material.

The entire lower surface of the lid 43 is coated with a metallic thin film 51.

The metallic thin film 51 may be formed only in an area 43a, which is to be bonded with an top end surface of the base 42, along the periphery of the lower surface of the lid 43 as illustrated by an imaginary line in FIG. 11.

In another embodiment, the lid 43 may be formed of a thin plate of an insulating material, such as quartz crystal and ceramics, and a metallic material, such as Kovar and SUS (stainless steel).

If the lid 43 is made of a metallic material, its metallic surface itself may be used as a surface to be bonded without use of the metallic thin film 51 depending on the quality of material.

A metallic thin film 52 is adhered to a top end surface of the base 42.

The metallic thin films 51 and 52 of the lid 43 and the base 42 are preferably formed by laminating an Au film on a base film made, e.g., of a Cr film, a Ni film, a Ni/Cr film, a Ti film, or a Ni—Cr film by a method such as sputtering, evaporation, or plating in the same way as for the upper and lower substrates 3 and 4 of the first embodiment.

Alternatively, the metallic thin films 51 and 52 may be formed of Al, Ag, Cu, Pd, Pt, Sn, Ti, Al/Si, or Ni/Cr.

According to a method of one embodiment of the invention, a metal paste sealing material 53 of one embodiment of the invention, which has been described above, is applied onto a metallic thin film 52 on the top end surface of the base 42 as illustrated in FIG. 9A.

The foregoing metal paste sealing material is applied in the same way by a method such as screen printing, a dispenser, or inkjet.

Then, a primary sintering process is performed by heating the base 42 at relatively low temperatures from about 200 to about 300° C. in the same way as in the first embodiment.

This sinters the metallic particles of the metal paste sealing material 53 to form a primary sintered body having the aforementioned porous structure.

Since heating in the primary sintering process is at relatively low temperatures, its thermal stress applied to the crystal resonator element 45 in the base 42 is suppressed.

In this state, characteristics testing and frequency measurement of the crystal resonator element 45 may be carried out, and further the excitation electrode 46 may be partially removed, e.g., by irradiation of laser light so that the frequency is adjusted.

Applying the metal paste sealing material 53 and the primary sintering process may be performed either before or after mounting the crystal resonator element 45 on the base 42.

Then, the lid 43 is placed on the top end surface of the base 42 while being aligned therewith, and pressure is applied under the same conditions as in the case of the first embodiment, thereby performing a secondary sintering process.

The foregoing primary sintered body has appropriate softness as described above, and therefore there is no possibility that applying pressure causes the material of the body to fly to adhere to the crystal resonator element 45 or to be left inside the cavity 44.

Thus, after the crystal resonator element 41 is sealed, its vibration characteristics are maintained without being deteriorated.

As illustrated in FIG. 9B, in the foregoing primary sintered body, the foregoing metallic particles are more densely melt bonded to form a recrystallized bond film 54 by the secondary sintering process.

In the bond film 54, the metallic particles are tightly bonded to the metallic thin film 51 of the lid to be integrated with each other in an interface of the metallic particles and the metallic thin film 51.

Thus, the base 42 and the lid 43 are bonded together with high air-tightness.

In the bond film 54 where the foregoing metallic particles are recrystallized, there is no possibility that the film is remelted in a high-temperature environment as in a bonding portion produced by a former brazing metal material.

This therefore ensures high air tightness over time.

Accordingly, if the crystal unit 41 is heated in a repair process of a faulty part after being mounted on a circuit board or the like, air tightness cannot be reduced, allowing high reliability to be maintained.

Further, applying pressure while heating at temperatures, e.g., from about 200 to about 350° C. allows the foregoing secondary sintering process to be performed better.

Since this heating is also at relatively low temperatures, its thermal stress applied to the crystal resonator element 45 is suppressed.

The secondary sintering process may be performed in a vacuum or desired gas atmosphere to vacuum seal or gas seal the crystal resonator element 45.

In the embodiment, a metal paste sealing material of one embodiment of the invention keeps sufficient and good shapability not only during its application but also after the primary and secondary sintering processes, and has high air tightness due to recrystallization of the metallic particles after the secondary sintering process.

This enables the sealing width on the top end surface of the base 42 to be made significantly narrower than a former one.

As a result, it is possible to reduce the outside dimensions of the base 42 to reduce the entire size of the crystal unit 1.

It is also possible to increase the dimensions of the cavity 44 while maintaining the outer dimensions of the base 42, and increase, by just the amount of the dimension increase of the cavity 44, the outside dimensions of the crystal resonator element 45 that can be mounted, thereby improving the characteristics of a crystal unit.

Similarly, a metal paste sealing material of one embodiment of the invention is applied not only to the top end surface of the base 42 but also to the metallic thin film 51 of the lid 43 to form a primary sintered body of the aforementioned porous structure by a primary sintering process.

This primary sintered body is brought into contact with the aforementioned primary sintered body on the top end surface of the base 42.

In this way, a secondary sintering process may be performed.

Alternatively, a metal paste sealing material of one embodiment of the invention is applied only to the metallic thin film 51 on the lid 43 to form a primary sintered body of the porous structure by the primary sintering process.

This primary sintered body is brought into contact directly with the metallic thin film 52 on the top end surface of the base 42.

In this way, the secondary sintering process may be performed.

In this case, since the foregoing primary sintering process is performed only for the lid 43, heating temperature cannot affect the crystal resonator element 45 mounted on the base 42.

The invention can be similarly applied to piezoelectric devices having package structures that are different from the above-mentioned first and second embodiments.

Figure 12:
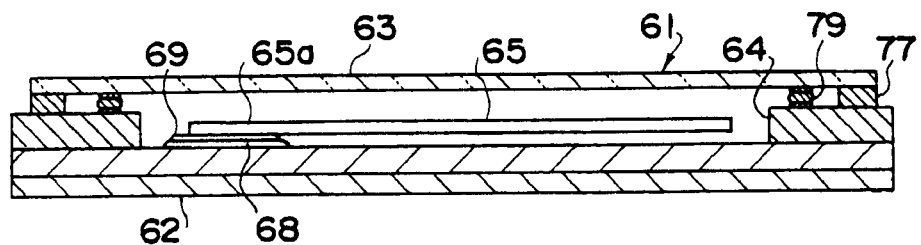
FIG. 12 is a sectional view of a crystal oscillator to which one embodiment of the invention is applied.

FIG. 12 illustrates a crystal oscillator 61 having a similar package structure to the second embodiment.

The crystal oscillator 61 is formed in a box shape having an open top by laminating a plurality of ceramic thin plates, like the base 42 in the second embodiment.

A crystal resonator element 65 is mounted in a cavity 64 defined inside the crystal oscillator 61.

The crystal resonator element 65 is a thickness shear mode resonator element made of an AT cut crystal plate, and excitation electrodes 66 are formed on both upper and lower surfaces of the element and leading electrodes 67 from the excitation electrodes are formed on both sides of one end, that is, a base portion 65a.

A pair of electrode pads 68 are formed near one end in the longitudinal direction on the bottom surface of a cavity 64 of a base 62.

The crystal resonator element 65 is electrically coupled and substantially horizontally supported while being cantilevered by the base portion 65a by fixing the leading electrodes to the electrode pads 68 corresponding thereto with a conductive adhesive 69.

Figure 13:
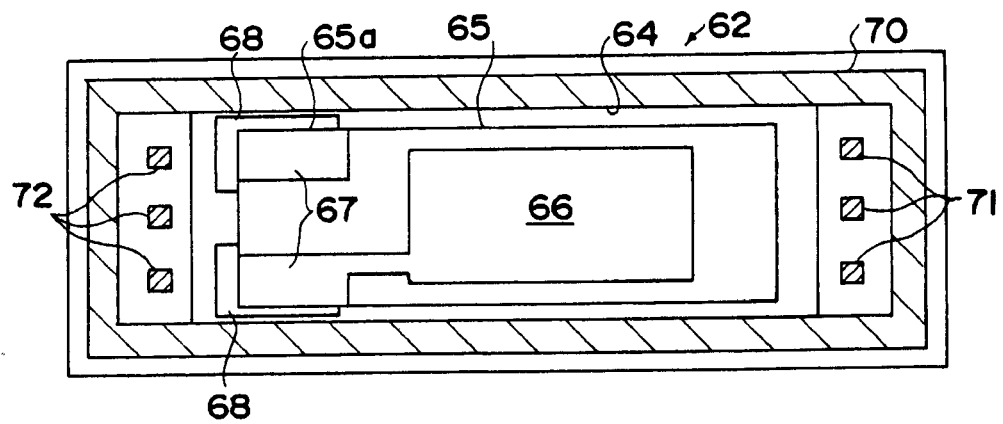
FIG. 13 is a plan view of a base of the crystal oscillator of FIG. 12.

As illustrated in FIG. 13, a metallic thin film 70 having a predetermined width adheres to the top end surface of the base 62 along the outer periphery.

Further, bonding pads 71 and 72 are formed inside the metallic thin film 70 to be separate therefrom on the top end surface in both ends in the longitudinal direction of the base 62.

The foregoing each bonding pad is used as a terminal coupled to the aforementioned excitation electrode of the crystal resonator element 65 or an outside power supply, a circuit, etc., through wiring, which is not illustrated.

A lid 63 of the present embodiment is formed of a flat, rectangular thin plate that is made of a silicon material.

Figure 14:
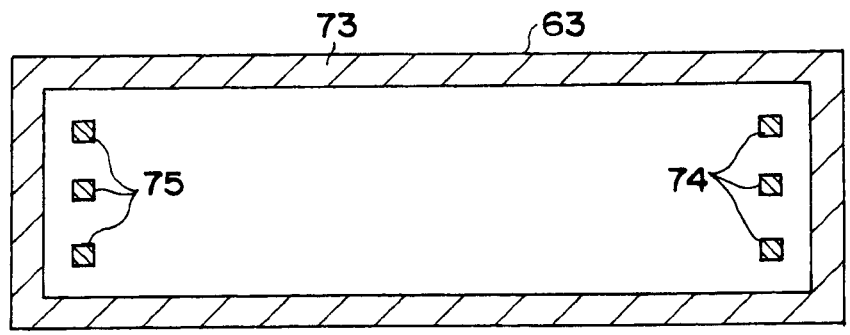
FIG. 14 is a bottom view of a lid of the crystal oscillator of FIG. 12.

As illustrated in FIG. 14, a metallic coating film 73 having a predetermined width adheres to an area, which is to be bonded with the top end surface of the base 62, along the outer periphery of the lower surface of the lid 63. Inside the metallic coating film 73, the bonding pads 74 and 75 are disposed, as terminals directly coupled to the bonding pads 71 and 72 on the top end surface of the base 62, respectively, at positions corresponding thereto in both ends in the longitudinal direction of the lid 63.

Further, in an area inside the metallic coating film 73 of the lid 63, an integrated circuit for controlling the drive of the crystal resonator element 65 and wiring coupling the integrated circuit with the bonding pads 74 and 75 are formed (not illustrated).

Figure 15A:
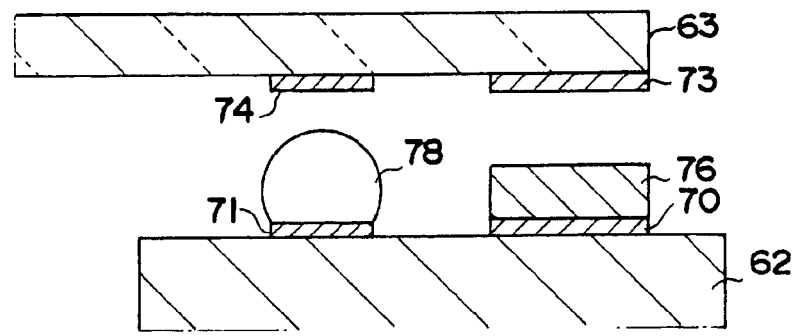
FIGS. 15A and 15B are partially enlarged sectional views illustrating a sealing process of the crystal oscillator of FIG. 12.
Figure 15B:
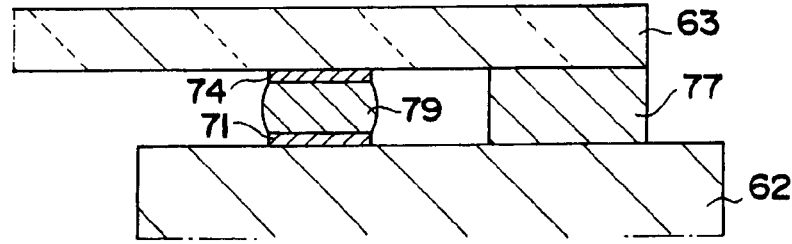

The base 62 and the lid 63 are bonded utilizing a method of one embodiment of the invention, as illustrated in FIGS. 15A and 15B.

In the same way as in the case of the second embodiment, a metal paste sealing material 76 of one embodiment of the invention is applied onto the metallic thin film 70 on the top end surface of the base 62 by a method such as the above-described screen printing.

A primary sintering process is performed by heating the base 62 at relatively low temperatures from about 200 to about 300° C., causing the metal paste sealing material 76 to become a primary sintered body of a porous structure.

On the other hand, on each bonding pad of the base 62, e.g., an Au ball 78 is deposited to form a bump as illustrated in FIG. 15A.

For the bump, various publicly known conductive materials, such as solder, other than Au may be used.

The bump may be formed on each bonding pad of the lid 63 instead of the bonding pad of the base 62.

Then, as illustrated in FIG. 15B, the lid 63 is placed on the top end surface of the base 62 while being aligned therewith, and applying pressure while heating in the same way as in the cases of the above-mentioned embodiments, thereby performing a secondary sintering process.

Accordingly, in the foregoing primary sintered body of the metal paste sealing material 76, metallic particles contained therein are densely melt bonded to be recrystallized.

The recrystallized metallic particles are integrated with the metallic thin film 70 of the base 62 and the metallic coating film 73 of the lid 63 to form a bond film 77.

At the same time, each bump 79 is deposited to each bonding pad of the lid 63 by effects caused by heating and applying pressure in the secondary sintering process.

Thus, each one of the bonding pads 71 and 72 of the base 62 are electrically coupled to each corresponding one of the bonding pads 74 and 75 of the lid 63.

The bonding pads of the base 62 and the bonding pads of the lid 63 can be electrically coupled to each other using various publicly known conductive coupling materials other than bumps of metal such as Au.

For example, conductive adhesives, conductive pastes, and metallic pastes can be used.

By means of the bond film 77, the base 62 and the lid 63 are bonded together with high air tightness so that the crystal resonator element 65 is vacuum sealed or gas sealed inside a package.

Further, according to the embodiment, the lid 63 functioning as a drive IC chip of the crystal resonator element 65 is hermetically bonded with the base 62 on which the crystal resonator element 65 is mounted.

This allows achievement of a smaller, lower surface mount crystal oscillator.

A crystal oscillator into which an IC chip to drive a crystal resonator element is integrated in this way can be applied to a package structure in the first embodiment.

Figure 16:
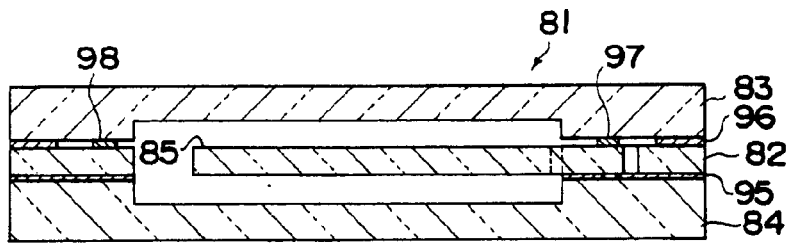
FIG. 16 is a sectional view of another crystal oscillator to which one embodiment of the invention is applied.

FIG. 16 illustrates a crystal oscillator 81 of such a package structure as in the first embodiment.

In the crystal oscillator 81, an upper substrate 83 serving as a cover of the package and a lower substrate 84 serving as a base are laminated on and under an intermediate crystal plate 82 having a crystal resonator element so that the substrates and the intermediate crystal plate are integrally bonded in the same way as for the crystal unit 1 in the first embodiment.

In the embodiment, the intermediate crystal plate 82 is formed of an AT cut crystal plate having a uniform thickness and the lower substrate 84 is formed of a crystal thin plate and a glass material or silicon, etc., whereas the upper substrate 83 is formed of a silicon material.

Figure 17:
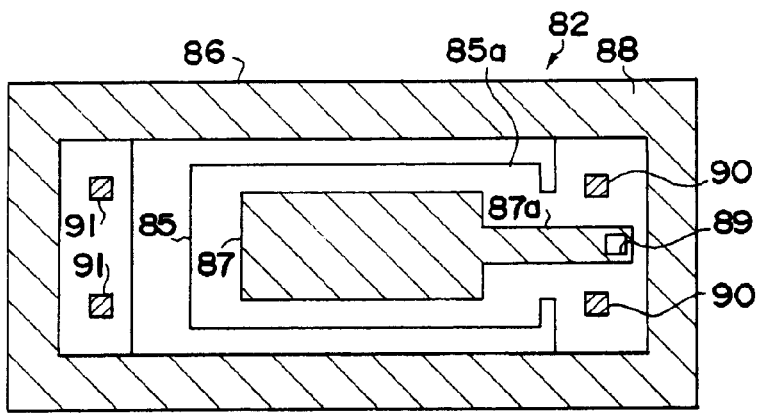
FIG. 17 is a top view of an intermediate crystal plate of the crystal oscillator of FIG. 16.

The intermediate crystal plate 82 includes a thickness shear mode crystal resonator element 85 and an outer frame 86 integrally connected thereto with a base portion 85a as illustrated in FIG. 17.

Formed on the upper and lower surfaces of the crystal resonator element 85 are excitation electrodes 87.

The excitation electrodes 87 are formed on the upper and lower surfaces of crystal resonator element 85, and each of wiring films 87a is led out from the base portion 85a to an end in the longitudinal direction of the outer frame 86 on a side where the crystal resonator element 85 is connected.

On the top surface of the outer frame 86, a conductive metallic thin film 88 having a predetermined width is formed along the outer periphery.

Although the conductive metallic thin film 88 and the wiring film 87a are separate in the embodiment as illustrated in the figure, they may be electrically coupled.

The lower surface of the intermediate crystal plate 82 is formed in the same way as the intermediate crystal plate 2 in FIG. 2.

A conductive metallic thin film is formed over all the periphery of the lower surface of the outer frame 86, and is electrically coupled to the foregoing wiring film led out from an excitation electrode of the lower surface of the crystal resonator element 85.

On an end in the longitudinal direction, on a side where the crystal resonator element 85 is connected, of the lower surface of the outer frame 86, a conductive metallic thin film separated from the foregoing wiring film is formed and is electrically coupled through a through-hole 89 to the wiring film 87a on the upper surface of the outer frame 86.

Further, on the upper surface at both ends in the longitudinal direction of the outer frame 86, bonding pads 90 and 91 are formed inside the conductive metallic thin film 88 and apart therefrom.

The bonding pads 90 and 91 are used as terminals coupled to the foregoing excitation electrodes of the crystal resonator element 85 or an outside power supply, a circuit, etc., through wiring, which is not illustrated.

Figure 18:
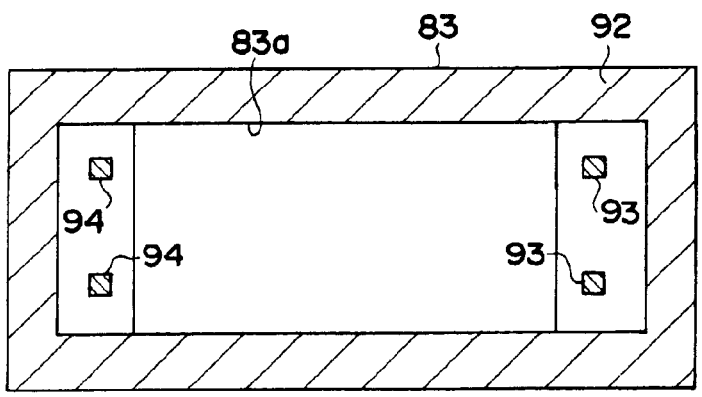
FIG. 18 is a bottom view of an upper substrate of the crystal oscillator of FIG. 16.

In the upper substrate 83, a recess 83a is formed in a surface facing the intermediate crystal plate 82, that is, the lower surface as illustrated in FIG. 18.

The periphery surrounding the recess 83a in the lower surface of the upper substrate 83 constitutes a surface to be bonded with the intermediate crystal plate 82, and is coated with a metallic thin film 92 that corresponds to the conductive metallic thin film 88 of the foregoing outer frame.

Inside the metallic coating film 92, bonding pads 93 and 94 are disposed, as terminals directly coupled to the bonding pads 90 and 91 on the upper surface of the outer frame 86 of the intermediate crystal plate 82, at positions corresponding to the bonding pads 90 and 91 in both ends in the longitudinal direction of the upper substrate 83, respectively.

Further, in an area inside the metallic coating film 92 of the upper substrate 83, an integrated circuit for controlling the drive of the crystal resonator element 85 and wiring coupling the integrated circuit with the bonding pads 93 and 94 are formed (not illustrated).

The intermediate crystal plate 82 and the upper and lower substrates 83 and 84 are bonded utilizing a method of one embodiment of the invention.

In the same way as in the case of the first embodiment, a metal paste sealing material of one embodiment of the invention is applied onto the foregoing conductive metallic thin films on the upper and lower surfaces of the outer frame 86 of the intermediate crystal plate 82.

A primary sintering process is performed by heating the intermediate crystal plate 82 at relatively low temperatures from about 200 to about 300° C., causing the foregoing metal paste sealing material to become a primary sintered body of a porous structure.

On each bonding pad on the upper surface of the outer frame 86 of the intermediate crystal plate 82, a bump made of various publicly known conductive materials such as an Au ball is formed in the same manner as illustrated in FIG. 15A.

The bump may be formed on each of the foregoing bonding pads on the upper substrate 83 instead of the intermediate crystal plate 82.

Then, the upper and lower substrates 83 and 84 are placed on top of the upper and lower surfaces of the intermediate crystal plate 82 while being aligned therewith, respectively, and a secondary sintering process is performed by applying pressure while heating in the same way as in the case of the first embodiment.

Accordingly, in the primary sintered body of the foregoing metal paste sealing material, metallic particles contained therein are densely melt bonded to be recrystallized, forming bond films 95 and 96.

At the same time, bumps 97 and 98 are deposited by effects caused by heating and applying pressure in the secondary sintering process.

Thus, each one of the bonding pads 90 and 91 of the intermediate crystal plate 82 is electrically coupled to each corresponding one of the bonding pads 93 and 94 of the upper substrate 83.

Further, the invention can be applied to quartz crystal devices such as crystal units and crystal oscillators having tuning fork crystal resonator elements.

Figure 19:
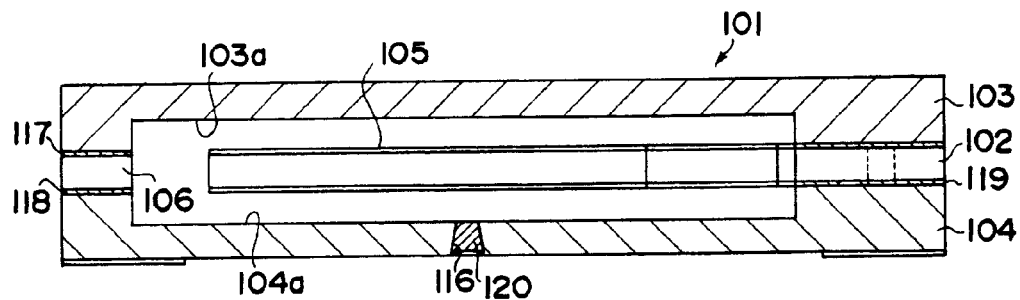
FIG. 19 is a sectional view of a tuning fork crystal unit to which one embodiment of the invention is applied.

FIG. 19 illustrates a tuning fork crystal unit 101 having a package structure of the first embodiment illustrated in FIG. 1.

In the crystal unit 101, an upper substrate 103 serving as a cover of the package and a lower substrate 104 serving as a base are laminated on and under a flat plate-shaped intermediate crystal plate 102 having a crystal resonator element so that the substrates and the intermediate crystal plate are integrally bonded in the same way as for the crystal unit 1 in the first embodiment.

The intermediate crystal plate 102 is formed of an AT cut crystal plate having a uniform thickness, and the upper and lower substrates 103 and 104 are preferably formed of a crystal thin plate or a glass material, silicon, and the like.

Figure 20A:
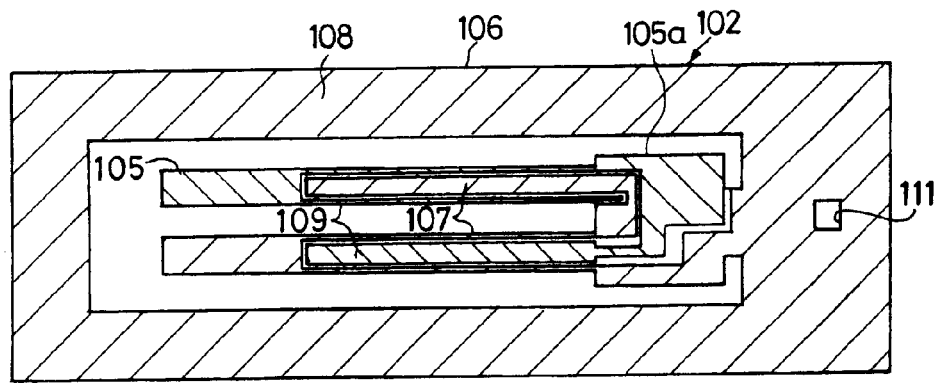
FIG. 20A is a top view of an intermediate crystal plate of the crystal unit of FIG. 19.
Figure 20B:
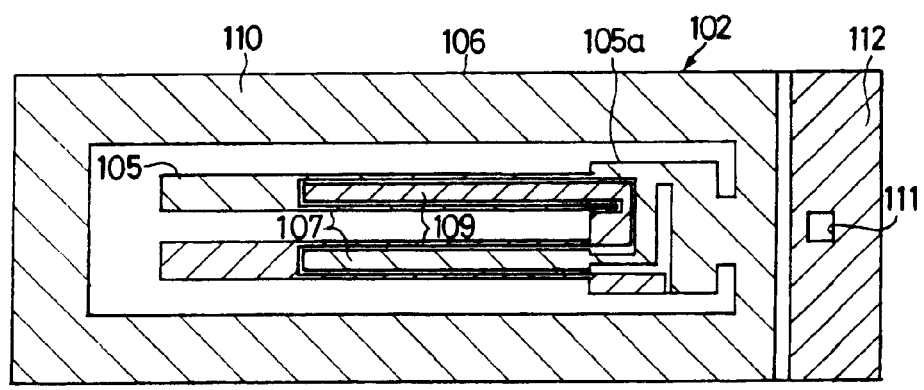
FIG. 20B is a bottom view of the intermediate crystal plate.

The intermediate crystal plate 102 includes a tuning fork crystal resonator element 105 having a pair of resonating arms and an outer frame 106 integrally connected thereto with a base portion 105a as illustrated in FIGS. 20A and 20B.

One excitation electrode 107 formed on a surface of the foregoing resonating arm is led out from the base portion 105a, and is electrically coupled to a conductive metallic thin film 108 on the upper surface of the outer frame 106.

The other excitation electrode 109 formed on the surface of the foregoing resonating arm is led out from the foregoing base portion in the same way, and is electrically coupled to a conductive metallic thin film 110 on the lower surface of the outer frame 106.

In an end, on a side where the crystal resonator element 105 is connected, in the longitudinal direction of the outer frame 106, a conductive metallic thin film 112 that is separate from the conductive metallic thin film 110 on the lower surface of the outer frame 106 is electrically coupled to the conductive metallic thin film 108 on the upper surface of the outer frame 106 through a conductive film inside a through hole 111.

Figure 21:
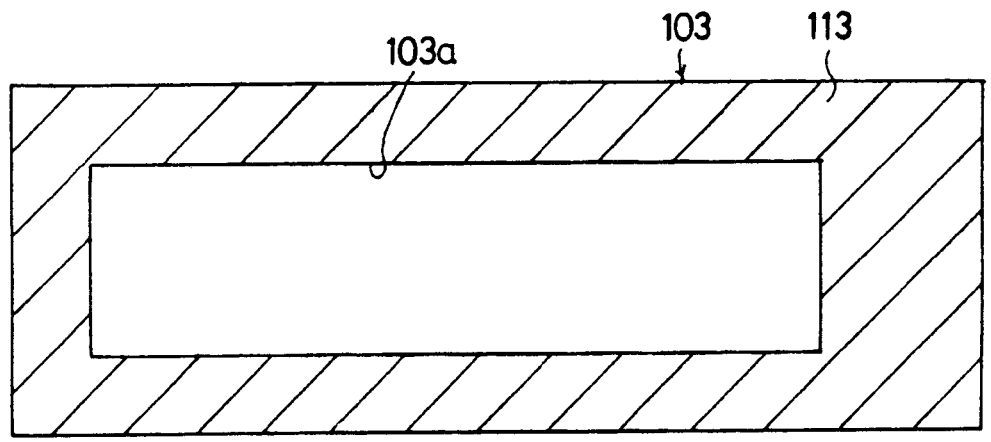
FIG. 21 is a bottom view of an upper substrate of the crystal unit of FIG. 19.

In the upper substrate 103, a recess 103a is formed in a surface facing the intermediate crystal plate 102, and a metallic thin film 113 is formed by the periphery surrounding the recess, that is, on a surface to be bonded with the intermediate crystal plate 102, as illustrated in FIG. 21.

Figure 22:
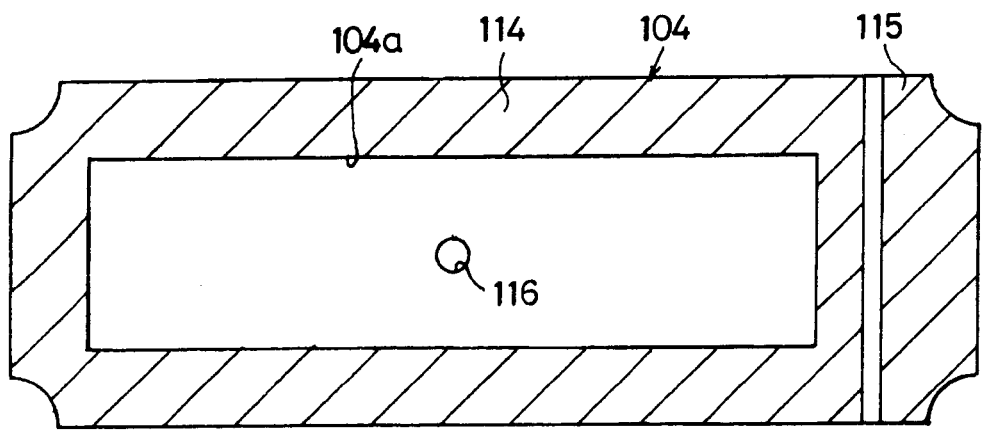
FIG. 22 is a top view of a lower substrate of the crystal unit of FIG. 19.

In the lower substrate 104, a recess 104a is formed on a surface facing the intermediate crystal plate 102, and metallic thin films 114 and 115 corresponding to the conductive metallic thin films 110 and 112 on the lower surface of the intermediate crystal plate by the periphery surrounding the recess, that is, on a surface to be bonded with the intermediate crystal plate 102, as illustrated in FIG. 22.

The crystal resonator element 105 is held and contained in a cavity defined by these recesses while being cantilevered by the base portion 105a.

Further, a sealing hole 116 is provided in and through the lower substrate 104 substantially at the center thereof.

The intermediate crystal plate 102 and the upper and lower substrates 103 and 104 are bonded utilizing a method of one embodiment of the invention.

In the same way as in the case of the first embodiment, a metal paste sealing material of one embodiment of the invention is applied onto the conductive metallic thin films 108, 110, and 112 on the lower surface of the outer frame 106 of the intermediate crystal plate 102.

A primary sintering process is performed by heating the intermediate crystal plate 102 at relatively low temperatures from about 200 to about 300° C., causing the foregoing metal paste sealing material to become a primary sintered body of a porous structure.

Then, the upper and lower substrates 103 and 104 are placed on top of the upper and lower surfaces of the intermediate crystal plate 102 while being aligned therewith, respectively, and a secondary sintering process is performed by applying pressure while heating in the same way as in the case of the first embodiment.

Accordingly, in the primary sintered body of the foregoing metal paste sealing material, metallic particles contained therein are densely melt bonded to be recrystallized.

This results in forming bond films 117 to 119 between the upper and lower surfaces of the intermediate crystal plate 102 and the upper and lower substrates 103 and 104, respectively, such that the crystal resonator element 105 is sealed in a package.

Then, the package is placed in a vacuum atmosphere, and the sealing hole 116 is hermetically closed with a sealant 120.

As the sealant 120, a low melting metallic material such as Au—Sn may be used.

The metallic material is placed in a sealing hole and is irradiated with laser light from the outside so that metallic material is deposited into the sealing hole.

It is desirable to coat the inner surface of the sealing hole in advance with a metallic film because this allows better deposition of a metallic material.

In this way, in the present embodiment, unnecessary gas, which can be generated from the foregoing metal paste sealing material during hermetic sealing of a package, can be excluded from the inside of the package using the foregoing sealing hole.

The crystal unit 101 can thus be sealed with a higher degree of vacuum.

Although preferred embodiments of the invention have been described in detail, it is to be understood that the invention may be practiced by adding various changes and modifications to the foregoing embodiments in its technical scope, as apparent to those skilled in the art.

For example, the aforementioned intermediate crystal plate may be formed of various publicly known piezoelectric materials such as lithium tantalite and lithium niobate other than quartz crystal.

The invention may also be applied to piezoelectric devices such as resonators, filters, and sensors other than crystal units or oscillators.

IC elements and the like may be mounted in a package in the same structure as in the second embodiment.

A piezoelectric vibrating gyro element instead of a crystal resonator element may also be mounted to constitute a piezoelectric vibrating gyro sensor.

Further, the invention may be applied so as to hermetically seal various electronic components other than piezoelectric devices in packages.

In this case, components constituting a package have metallic surfaces as surfaces to be bonded with each other.

A metal paste sealing material of one embodiment of the invention is applied to at least one metallic surface, and a primary sintering process is performed by heating the surface in the same way as each of the aforementioned embodiments.

After a primary sintered body having the aforementioned porous structure is formed, both components are put together while one metallic surface having the primary sintered body formed thereon is brought into contact with the other metallic surface.

Metallic particles contained in the primary sintered body are densely recrystallized by applying pressure to the primary sintered body while optionally heating it, thereby performing a secondary sintering process.

Thus, the package can be hermetically bonded to hermetically seal electronic components inside the package.

What is claimed is:

1. A quartz crystal device comprising:
   a crystal resonator element; and
   a package including a plurality of components, the plurality of components being bonded using a metal paste sealing material containing a metallic particle having an average particle size from 0.1 to 1.0 µm, an organic solvent, and a resin material in proportions of from 88 to 93 percent by weight, from 5 to 15 percent by weight, and from 0.01 to 4.0 percent by weight, respectively, to hermetically seal the crystal resonator element in the package.

2. The quartz crystal device according to claim 1, the metallic particle of the metal paste sealing material being made of at least one kind of Au, Ag, Pt, and Pd.

3. The quartz crystal device according to claim 1,
   the plurality of components including an intermediate crystal plate in which the crystal resonator element and an outer frame are integrally connected, and an upper substrate and a lower substrate bonded with upper and lower surfaces of the intermediate crystal plate, respectively, with the metal paste sealing material.

4. The quartz crystal device according to claim 1,
   the plurality of components including a base, formed in a box shape having an open top, and a lid hermetically bonded onto a top end surface of the base with the metal paste sealing material;
   the lid being made of a silicon material on which an integrated circuit that drives the crystal resonator element is formed, and has a terminal coupled to the integrated circuit on a lower surface of the lid;
   the base having a terminal at a position corresponding to the terminal of the lid on the top end surface of the base; and
   the terminal of the lid being directly coupled with the terminal of the base with a conductive coupling material.

* * * * *